United States Patent

Kanamori

(10) Patent No.: US 9,378,816 B2
(45) Date of Patent: Jun. 28, 2016

(54) VARIABLE RESISTANCE MEMORY DEVICES AND ERASE VERIFYING METHODS THEREOF

(71) Applicant: Samsung Electronics Co., Ltd., Suwon-Si, Gyeonggi-Do (KR)

(72) Inventor: Kohji Kanamori, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 242 days.

(21) Appl. No.: 14/015,869

(22) Filed: Aug. 30, 2013

(65) Prior Publication Data

US 2014/0063914 A1 Mar. 6, 2014

(30) Foreign Application Priority Data

Aug. 31, 2012 (KR) .................. 10-2012-0096415

(51) Int. Cl.
*G11C 13/00* (2006.01)
*G11C 11/56* (2006.01)

(52) U.S. Cl.
CPC ........ *G11C 13/0064* (2013.01); *G11C 11/5685* (2013.01); *G11C 13/0007* (2013.01); *G11C 13/0097* (2013.01); *G11C 2213/71* (2013.01); *G11C 2213/77* (2013.01)

(58) Field of Classification Search
CPC ........... G11C 11/5685; G11C 13/0007; G11C 2213/77; G11C 13/0064; G11C 13/0097; G11C 2213/71

See application file for complete search history.

(56) References Cited

U.S. PATENT DOCUMENTS

| | | | |
|---|---|---|---|
| 7,057,922 B2 | 6/2006 | Fukumoto | |
| 7,266,018 B2 | 9/2007 | Zhang | |
| 7,382,647 B1 | 6/2008 | Gopalakrishnan | |
| 7,443,710 B2 | 10/2008 | Fang et al. | |
| 7,830,701 B2 | 11/2010 | Siau et al. | |
| 7,869,258 B2 | 1/2011 | Scheuerlein et al. | |
| 8,059,450 B2 | 11/2011 | Xi et al. | |
| 8,223,530 B2 | 7/2012 | Kitagawa | |
| 2004/0174732 A1 | 9/2004 | Morimoto | |
| 2004/0257864 A1 | 12/2004 | Tamai et al. | |
| 2005/0122768 A1 | 6/2005 | Fukumoto | |
| 2006/0067105 A1 | 3/2006 | Fang et al. | |
| 2006/0114723 A1 | 6/2006 | Ju | |
| 2006/0114725 A1 | 6/2006 | Jeong et al. | |
| 2006/0227616 A1 | 10/2006 | Zhang | |
| 2008/0165585 A1* | 7/2008 | Surico et al. | 365/185.22 |
| 2009/0027977 A1* | 1/2009 | Rinerson et al. | 365/189.15 |

(Continued)

FOREIGN PATENT DOCUMENTS

| JP | H09-180475 A | 7/1997 |
|---|---|---|
| JP | 2004-272975 A | 9/2004 |

(Continued)

*Primary Examiner* — Khamdan Alrobaie
(74) *Attorney, Agent, or Firm* — Harness, Dickey & Pierce, PLC

(57) ABSTRACT

An erase verifying method includes applying a first voltage to a plurality of word lines connected to a memory cell block, and applying a second voltage less than the first voltage to a plurality of bit lines connected to the memory cell block. The method includes sensing bit line currents flowing through the plurality of bit lines, and comparing the sensed bit line currents with a reference current. The method also includes determining that the memory cell block has been sufficiently erased by a first erase operation if each of the sensed bit line currents is less than the reference current.

12 Claims, 11 Drawing Sheets

(56) References Cited

U.S. PATENT DOCUMENTS

| | | |
|---|---|---|
| 2009/0161408 A1* | 6/2009 | Tanigami et al. ............. 365/148 |
| 2009/0201710 A1* | 8/2009 | Ueda ............................... 365/51 |
| 2009/0323391 A1 | 12/2009 | Scheuerlein et al. |
| 2010/0073990 A1 | 3/2010 | Siau et al. |
| 2010/0214818 A1 | 8/2010 | Kitagawa et al. |
| 2010/0226164 A1* | 9/2010 | Nagashima et al. .......... 365/148 |
| 2010/0237311 A1 | 9/2010 | Okajima |
| 2010/0271861 A1 | 10/2010 | Kitagawa |
| 2010/0271862 A1 | 10/2010 | Yoon et al. |
| 2011/0026302 A1 | 2/2011 | Xi et al. |
| 2011/0068409 A1 | 3/2011 | Kim et al. |
| 2012/0206975 A1* | 8/2012 | Yang ........................ 365/185.22 |

FOREIGN PATENT DOCUMENTS

| | | |
|---|---|---|
| JP | 2009-099199 A | 5/2009 |
| JP | 2010-198702 A | 9/2010 |
| JP | 2010-225813 A | 10/2010 |
| KR | 10-2004-0077739 A | 9/2004 |
| KR | 10-2004-0111205 A | 12/2004 |
| KR | 100642911 B1 | 11/2006 |
| KR | 100648254 B1 | 11/2006 |
| KR | 2010-0116938 A | 11/2010 |
| KR | 10-2011-0073648 A | 3/2011 |

* cited by examiner

VARIABLE RESISTANCE MEMORY DEVICES AND ERASE VERIFYING METHODS THEREOF

CROSS-REFERENCE TO RELATED APPLICATIONS

A claim for priority under 35 U.S.C. §119 is made to Korean Patent Application No. 10-2012-0096415 filed Aug. 31, 2012, in the Korean Intellectual Property Office, the entire contents of which are hereby incorporated by reference.

BACKGROUND

At least one inventive concept relates to semiconductor memory devices, and more particularly, to variable resistance memory devices and/or erase verifying methods thereof.

Demand for nonvolatile semiconductor memory devices capable of realizing high density and large capacity is gradually increasing. Accordingly, research is being conducted on nonvolatile random access elements having improved performance. For example, the nonvolatile random access elements may include a ferroelectric random access memory (FRAM) element using a ferroelectric capacitor, a magnetic RAM (MRAM) element using a tunneling magneto-resistive (TRM) film, a phase change memory element using chalcogenide alloys, a resistive RAM (RRAM) element using a variable resistance material film, and so on.

In the RRAM technology, memory characteristics such as high speed, large capacity, low power, and so on are possible. Thus, research for improving these memory characteristics is being conducted within the RRAM field. Variable resistance material films of RRAMs may show a reversible resistance variation according to a polarity or magnitude of an applied pulse. The variable resistance material films may include a CMR (Colossal Magneto-Resistive) material layer having a Perovskite structure or a metal oxide layer having conductive filament that is generated or dissipated by an electric pulse. A memory using a variable resistance material film including the RRAM may be referred to as a variable resistance memory.

SUMMARY

At least one example embodiment relates to an erase verifying method that includes applying a first voltage to a plurality of word lines connected to a memory cell block. The method includes applying a second voltage less than the first voltage to a plurality of bit lines connected to the memory cell block. The method also includes sensing bit line currents flowing through the plurality of bit lines, and comparing the sensed bit line currents with a reference current. The method further includes determining that the memory cell block has been sufficiently erased by a first erase operation if each of the sensed bit line currents is less than the reference current.

According to at least one example embodiment, the second voltage is a ground voltage.

According to at least one example embodiment, the applying a first voltage includes applying the first voltage to all word lines connected to the memory cell block.

According to at least one example embodiment, the method further includes determining that the memory cell block has not been sufficiently erased by the first erase operation if at least one of the sensed bit line currents is greater than the reference current, and performing a second erase operation on the memory cell block.

According to at least one example embodiment, the reference current is based on a number of the plurality of word lines.

According to at least one example embodiment, the reference current is based on a product of the number of the plurality of word lines and an erase current, and the erase current is a current flowing through a memory cell of the memory cell block. The memory cell has a variable resistance value corresponding to an erase resistance, and the erase resistance is a lower limit resistance value of the memory cell in an erased state.

According to at least one example embodiment, the reference current has a value greater than a product of the number of the plurality of word lines and the erase current.

According to at least one example embodiment, the reference current has a value less than a program current. The program current is a current flowing through a memory cell of the memory block. The memory cell has a variable resistance value corresponding to a program resistance, and the program resistance is an upper limit resistance value of the memory cell in a programmed state.

According to at least one example embodiment, the applying a second voltage includes applying the second voltage to all bit lines connected to the memory cell block.

At least one example embodiment relates to an erase verifying method of a variable resistance memory device having a plurality of bit line groups connected to a memory cell group, the method including selecting one of the plurality of bit line groups. The method includes applying a first voltage to a plurality of word lines connected to the memory cell block, and applying a second voltage less than the first voltage to a selected one of the plurality of bit line groups. The method also includes sensing bit line currents flowing through bit lines in the selected bit line group. The method further includes determining whether an erase operation of the memory cell block is completed based on the sensed bit line currents.

According to at least one example embodiment, the method further includes applying the first voltage to unselected bit line groups of the plurality of bit line groups.

According to at least one example embodiment, the determining includes comparing the sensed bit line currents with a reference current, and selecting a next bit line group if each of the sensed bit line currents is less than a reference current.

According to at least one example embodiment, the memory cell block is determined to be sufficiently erased if each of the sensed bit line currents of all selected bit line groups is less than the reference current.

According to at least one example embodiment, the reference current is greater than a product of a number of the plurality of word lines and an erase current and less than a program current. The erase current is a current flowing through a first memory cell of the memory cell group. The first memory cell has a variable resistance value corresponding to an erase resistance, the erase resistance being a lower limit resistance value of the first memory cell in an erased state. The program current is a current flowing through a second memory cell of the memory cell group. The second memory cell has a variable resistance value corresponding to a program resistance, the program resistance being an upper limit resistance value of the second memory cell in a programmed state.

According to at least one example embodiment, a variable resistance memory device includes a memory cell block, and an input/output driver connected with the memory cell block via a plurality of word lines and a plurality of bit lines. The memory device also includes a control logic configured to control the input/output driver at an erase verifying operation such that a first voltage is applied to the plurality of word lines and a second voltage lower than the first voltage is applied to the plurality of bit lines.

At least one example embodiment relates to a method for erasing a memory cell block, the method including performing a first erase operation on at least one selected memory cell of the memory cell block. The method includes applying a first voltage to at least one word line connected to the at least one selected memory cell, and applying a second voltage to at least one bit line connected to the at least one selected memory cell, the second voltage being different from the first voltage. The method also includes sensing at least one bit line current flowing through the at least one bit line, and comparing the sensed at least one bit line current with a reference current. The method further includes determining whether the at least one selected memory cell is sufficiently erased based on the comparing.

According to at least one example embodiment, the at least one selected memory cell is determined to be sufficiently erased if the sensed at least one bit line current is less than the reference current.

According to at least one example embodiment, the method further includes performing a second erase operation on the at least one selected memory cell if the at least one selected memory cell is determined to not be sufficiently erased.

According to at least one example embodiment, wherein the at least one selected memory cell is determined to not be sufficiently erased if the sensed at least one bit line current is greater than the reference current.

According to at least one example embodiment, the second voltage is less than the first voltage.

According to at least one example embodiment, the memory cell block is a three-dimensional memory cell block.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION OF EXAMPLE EMBODIMENTS

Figure 1:
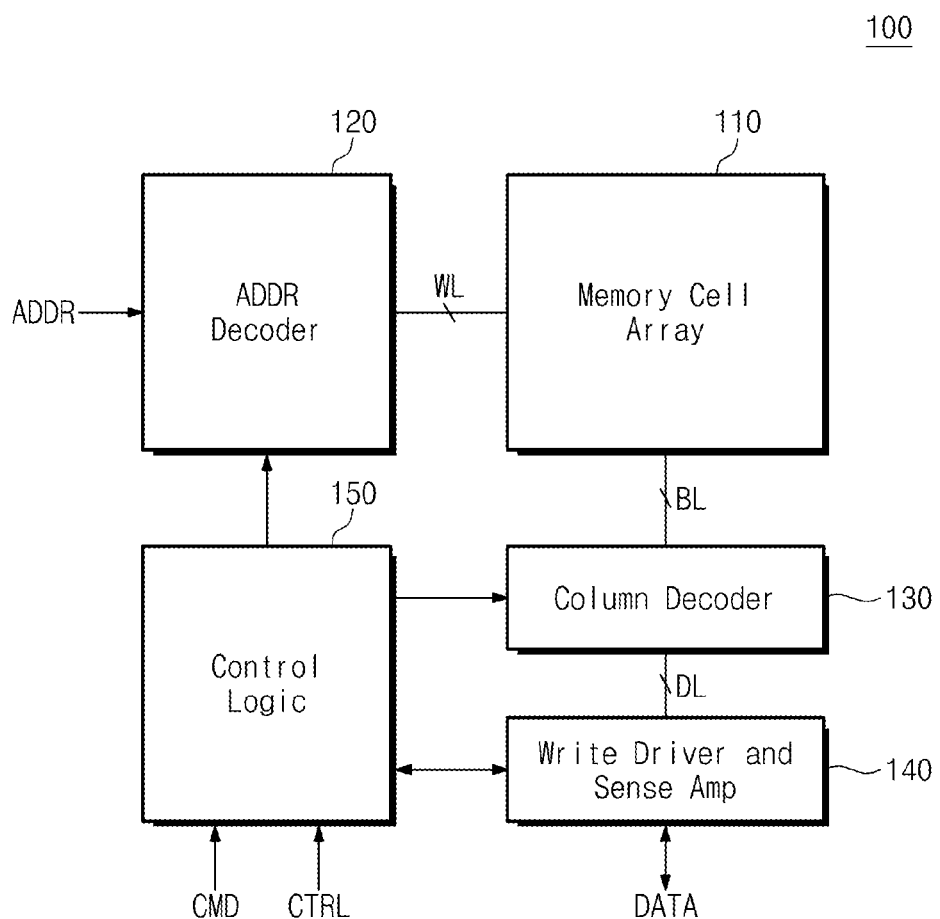
FIG. 1 is a block diagram schematically illustrating a variable resistance memory device according to at least one example embodiment of inventive concepts.

Example embodiments will be described in detail with reference to the accompanying drawings. Inventive concepts, however, may be embodied in various different forms, and should not be construed as being limited only to the illustrated embodiments. Rather, these embodiments are provided as examples so that this disclosure will be thorough and complete, and will fully convey inventive concepts to those skilled in the art. Accordingly, known processes, elements, and techniques are not described with respect to some of the embodiments of inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a variable resistance memory device according to at least one example embodiment of inventive concepts. Referring to FIG. 1, a variable resistance memory device 100 may include a memory cell array 110, an address decoder 120, a column decoder 130, a write driver and sense amplifier block 140, and control logic 150.

The memory cell array 110 may be connected to the address decoder 120 via word lines WL and to the column decoder 130 via bit lines BL. The memory cell array 110 may include a plurality of memory blocks, each of which includes a plurality of memory cells forming cell strings. Each memory cell may store one or more bits. Memory blocks of the memory cell array 110 will be described more fully described with reference to FIGS. 2 and 3.

The address decoder 120 may be connected to the memory cell array 110 via the word lines WL. The address decoder 120 may receive an address ADDR. The address decoder 120 may select the word lines WL according to one or more control signals from the control logic 150. The row decoder 120 may transfer a voltage supplied from the control logic 150 to the word lines WL.

The column decoder 130 may be connected to the memory cell array 110 via the bit lines BL. The column decoder 130 may select the bit lines BL according to one or more control signals from the control logic 150. The column decoder 130 may transfer a voltage supplied from the control logic 150 to the bit lines BL.

The write driver and sense amplifier block 140 may be connected to the bit lines BL via the column decoder 130. The write driver and sense amplifier block 140 may operate in response to one or more signals from the voltage generator and control logic 150. The write driver and sense amplifier block 140 may be configured to write data to memory cells connected to bit lines selected by the column decoder 130 or to read data therefrom. Data read by the write driver and sense amplifier block 140 may be output to an external device.

The control logic 150 may be configured to control an operation of the variable resistance memory device 100 via the one or more control signals. For example, the control logic 150 may operate in response to input control signal CTRL and command CMD. The control logic 150 may control reading, writing, or erasing of the variable resistance memory device 100.

Figure 2:
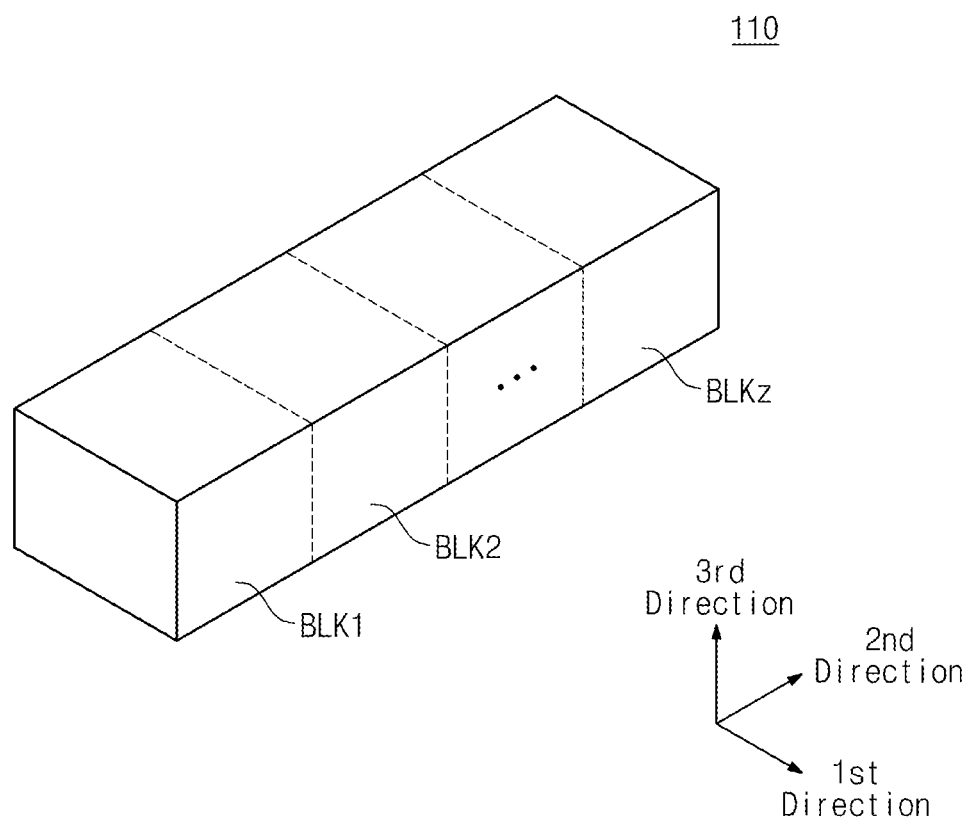
FIG. 2 is a diagram schematically illustrating the memory cell array in FIG. 1.

FIG. 2 is a diagram schematically illustrating a memory cell array in FIG. 1. Referring to FIGS. 1 and 2, a memory cell array 110 may include a plurality of memory blocks BLK1 to BLKz, each of which has a three-dimensional structure (or, a vertical structure). Each memory block may include a plurality of cell strings extending along a direction perpendicular to a substrate (e.g., the $3^{rd}$ direction).

Cell strings in one memory block may be connected to a plurality of bit lines BL, a plurality of string selection lines, and a plurality of word lines. Cell strings in the memory blocks BLK1 to BLKz may share the plurality of bit lines.

The memory blocks BLK1 to BLKz may be selected by an address decoder 120 illustrated in FIG. 1. For example, the address decoder 120 may be configured to select a memory block corresponding to a row address from among the memory blocks BLK1 to BLKz.

In a variable resistance memory device 100, an erase operation may be performed by a memory block unit. The memory block unit may apply a reset pulse may to a memory block to erase the memory block. After the reset pulse is applied, an erase verifying operation may be performed to check whether the memory block is normally (or sufficiently) erased.

The variable resistance memory device 100 may perform erase verifying operations on word lines in a memory block at the same time. Because the variable resistance memory device 100 does not select word lines independently, a time taken to perform an erase verifying operation may be reduced.

Figure 3:
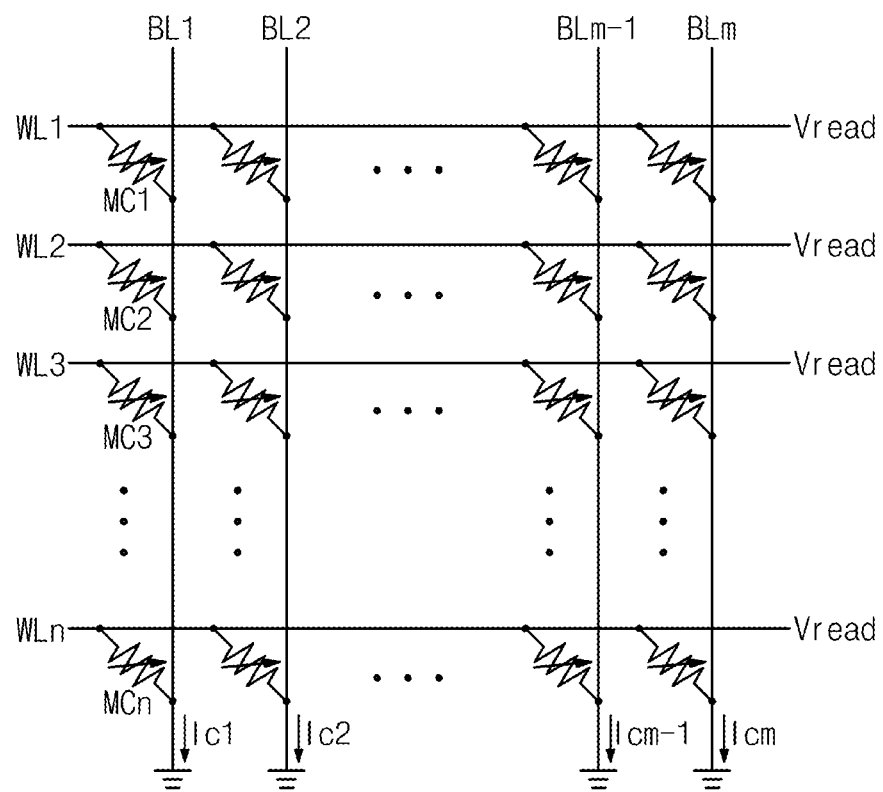
FIG. 3 is a diagram illustrating an erase verifying operation of the memory block of FIG. 2.

FIG. 3 is a diagram illustrating an erase verifying operation of the memory block of FIG. 2. Referring to FIG. 3, a memory block BLKa may include a plurality of memory cells. According to at least one example embodiment, the memory block BLKa may include a plurality of memory cells connected to n word lines WL1 to WLn and m bit lines BL1 to BLm.

During an erase verifying operation, the address decoder 120 may apply a read voltage to word lines WL. In at least one example embodiment, a read voltage Vread may be applied to all word lines WL1 to WLn of the memory block BLKa. However, inventive concepts are not limited thereto.

The column decoder 130 may apply a ground voltage to the bit lines BL1 to BLm. A voltage difference may be generated between both ends of each memory cell by voltages applied to the word lines WL1 to WLn and the bit lines BL1 to BLm. Bit line currents Ic1 to Icm may be generated at the bit lines BL1 to BLm by the voltage difference. A first bit line current Ic1 flowing at the first bit line BL1 may be a sum of currents flowing at memory cells MC1 to MCn connected in parallel with the first bit line BL1 and word lines WL1 to WLn.

The variable resistance memory device 100 may sense the bit line currents Ic1 to Icm. The variable resistance memory device 100 may compare the sensed bit line currents Ic1 to Icm with a reference current Iref to determine whether all memory cells connected with each bit line have been normally (or sufficiently) erased.

The reference current Iref may be determined according to erase states (or reset states) of a plurality of memory cells at the same time. This will be more fully described with reference to FIG. 4.

Figure 4:
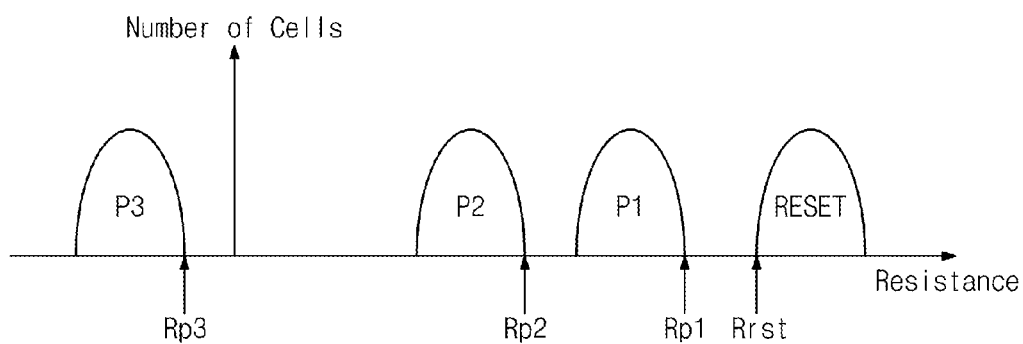
FIG. 4 is a diagram illustrating a variable resistance distribution of memory cells of the memory block of FIG. 3.

FIG. 4 is a diagram illustrating a variable resistance distribution of memory cells of the memory block of FIG. 3. In FIG. 4, the horizontal axis may indicate a resistance value, and the vertical axis may indicate the number of memory cells.

Referring to FIG. 4, each of the memory cells of a memory block BLKa may have one of four states (i.e., RESET, P1, P2, and P3) according to a resistance value of an individual memory cell. However, inventive concepts are not limited thereto. For example, memory cells may be single-bit cells, each cell having one of two states. Alternatively, memory cells may be multi-bit cells, each cell having one of four or more states.

An erase resistance value Rrst may be a lower limit resistance value of the memory cell determined to have the RESET state. For example, an erase current value Irst may be a current value flowing at an erase verifying bias condition when a memory cell has the erase resistance value Rrst.

A first program resistance value Rp1 may be an upper limit resistance value of a memory cell that has the first program state P1. A first program current value Ip1 may be a current value flowing at an erase verifying bias condition when a memory cell has the first program resistance value Rp1.

A second program resistance value Rp2 may be an upper limit resistance value of a memory cell that has the second program state P2. A third program resistance value Rp3 may be an upper limit resistance value of a memory cell that has the third program state P3. A second program current value Ip2 may be a current value flowing at an erase verifying bias condition when a memory cell has the second program resistance value Rp2. A third program current value Ip3 may be a current value flowing at an erase verifying bias condition when a memory cell has the third program resistance value Rp3.

In at least one example embodiment, a memory cell having the largest resistance value at an erase state may have the RESET state. Thus, under a same bias condition as that associated with program states P1 to P3, a current flowing through a memory cell in the RESET state may be smallest compared to the other states. A reference current Iref may be decided by equation 1 below.

$$Irst \times n \leq Iref < Ip1 \quad (1)$$

In the equation 1, n may indicate the number of word lines of a memory block (being an erase unit) to be measured at the same time.

The reference current Iref may be larger than or equal to a maximum value of a current flowing via a bit line when all memory cells are at the erase state RESET. Also, the reference current Iref may be less than the first program current value Ip1 flowing when one memory cell has the first program state P1.

All memory cells in a memory block may be normally (or sufficiently) erased when each of bit line currents Ic1 to Icm is less than the reference current Iref. If at least one of the bit line currents Ic1 to Icm is larger than the reference current Iref, memory cells connected with a bit line having a bit line current larger than the reference current Iref may be determined as not being normally (or sufficiently) erased.

Figure 5:
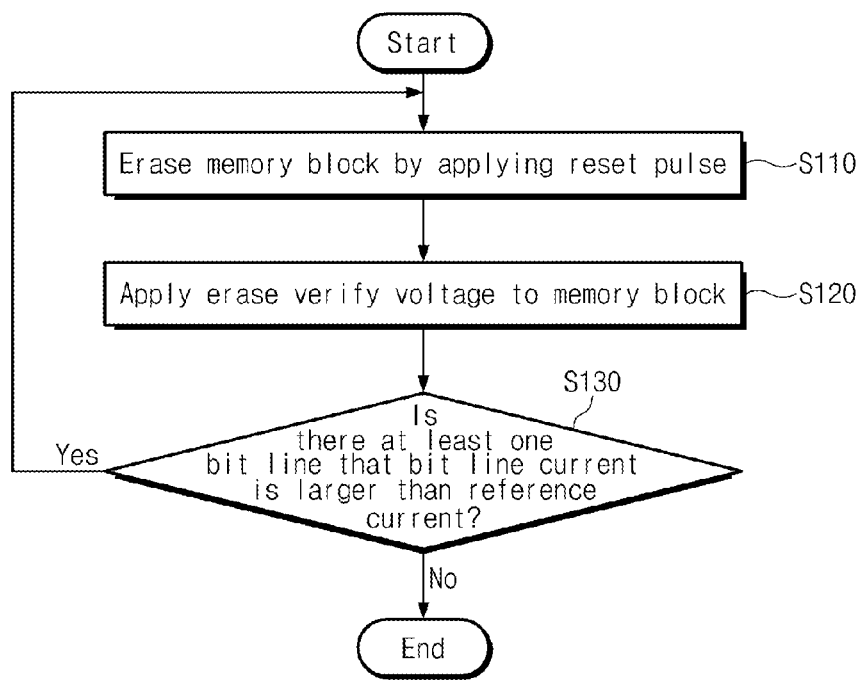
FIG. 5 is a flow chart illustrating an erase verifying method of the variable resistance memory device of FIG. 1.

FIG. 5 is a flow chart illustrating an erase verifying method of the variable resistance memory device of FIG. 1. According to the erase verifying method of FIG. 5, erase verifying operations on a plurality of word lines may be performed at the same time, so that an erase verifying operation is expedited.

In operation S110, a selected memory block may be erased. The selected memory block may be erased by applying a reset pulse to memory cells of the selected memory block via address decoder 120 and column decoder 130.

In operation S120, an erase verify voltage may be applied to the selected memory block. For example, a ground voltage may be applied to bit lines of the selected memory block via column decoder 130, and a read voltage may be applied to word lines of the selected memory block via address decoder 120.

In operation S130, bit line currents of the selected memory block may be sensed by write driver and sense amplifier 140. The sensed bit line currents may be compared with a reference current. If at least one of the sensed bit line currents is larger than the reference current, an erase operation on memory cells not yet erased may be again performed. If all of the sensed bit line currents are less than the reference current, an erase operation on the selected memory block may be determined as completed.

With the erase verifying method of the variable resistance memory device, a read voltage may be applied to a plurality of word lines via address decoder 120. Thus, the variable resistance memory device may simultaneously perform an erase verifying operation on memory cells connected with a plurality of word lines through one comparison operation. Thus, it is possible to rapidly perform an erase verifying operation.

Figure 6:
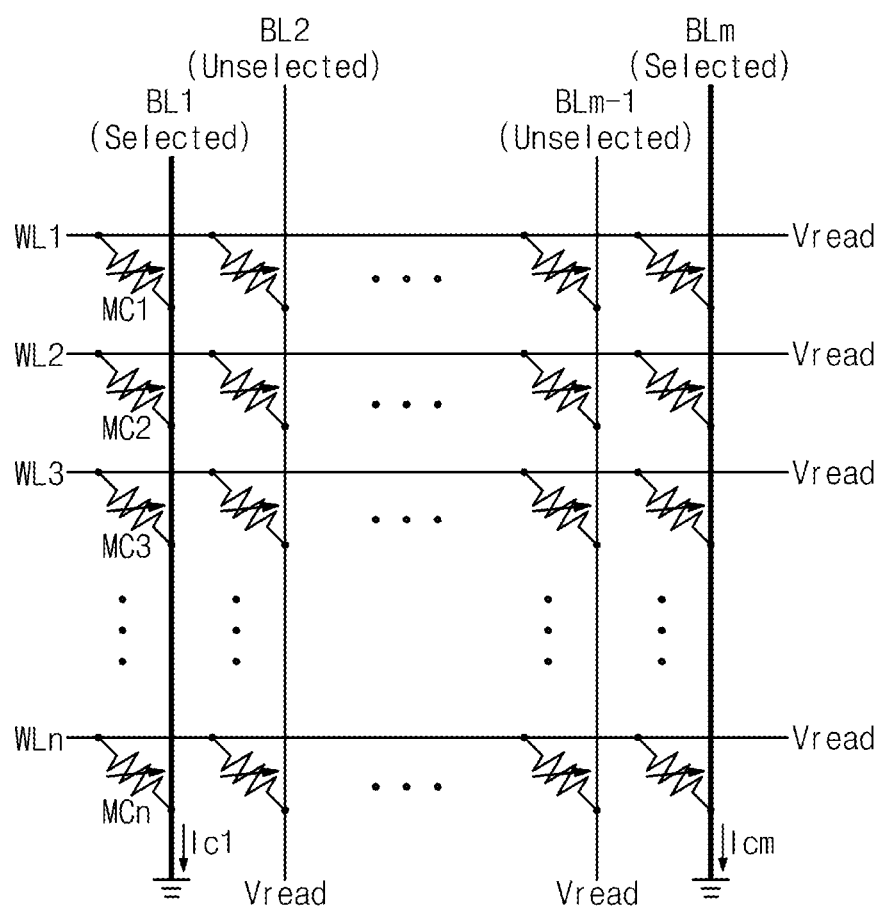
FIG. 6 is a diagram illustrating at least one other example embodiment of an erase verifying operation of the memory block of FIG. 2.

FIG. 6 is a diagram illustrating at least one other example embodiment of an erase verifying operation of the memory block of FIG. 2. Referring to FIG. 6, a memory block BLKa may include a plurality of memory cells. In at least one example embodiment, the memory block BLKa may include a plurality of memory cells connected with n word lines WL1 to WLn and m bit lines BL1 to BLm. The bit lines BL1 to BLm may be divided into a plurality of groups.

During an erase verifying operation, a read voltage may be applied to a plurality of word lines. For example, a read voltage Vread may be applied to all word lines WL1 to WLn of the memory block BLKa. However, inventive concepts are not limited thereto.

During the erase verifying operation, one group of bit lines may be selected. A ground voltage may be applied to bit lines of the selected group by column decoder 130. A read voltage Vread may be applied to bit lines of unselected groups by column decoder 130.

A voltage difference may be generated between both ends of each memory cell connected with the bit line of the selected group as a result of voltages applied to the word lines WL1 to WLn and the bit lines of the selected group. Bit line currents may be generated at the bit lines of the selected group by the voltage difference.

Because a same read voltage Vread is applied to the word lines WL1 to WLn and bit lines of unselected groups, no voltage difference is generated between both ends of each memory cell. Thus, no current flows through memory cells connected with the bit lines of the unselected groups.

The variable resistance memory device 100 may sense the bit line currents of the bit lines of the selected group. The variable resistance memory device 100 may compare the sensed bit line currents with a reference current Iref to determine whether all memory cells connected with each bit line of the selected group are normally (or sufficiently) erased.

If all of the sensed bit line currents are less than the reference current, a next group of bit lines may be selected by, for example, the control logic 150. If at least one of the sensed bit line currents is larger than the reference current, an erase operation on memory cells not normally (or sufficiently) erased may be performed again. The erase operation of the selected memory block may be ended when the erase verifying operation determines that all groups of bit lines are normally (or sufficiently) erased.

The variable resistance memory device 100 may apply a read voltage to a plurality of word lines. The variable resistance memory device 100 may perform an erase verifying operation on memory cells connected to a plurality of word lines. The erase verifying operation may be performed on multiple memory cells at the same time through one comparison operation. Thus, it is possible to expedite the erase verifying operation.

Also, the variable resistance memory device 100 may divide bit lines into a plurality of groups and perform an erase verifying operation each group. Accordingly, a current consumed during an erase operation may be reduced, and an erase verifying operation may be accurately performed.

Figure 7:
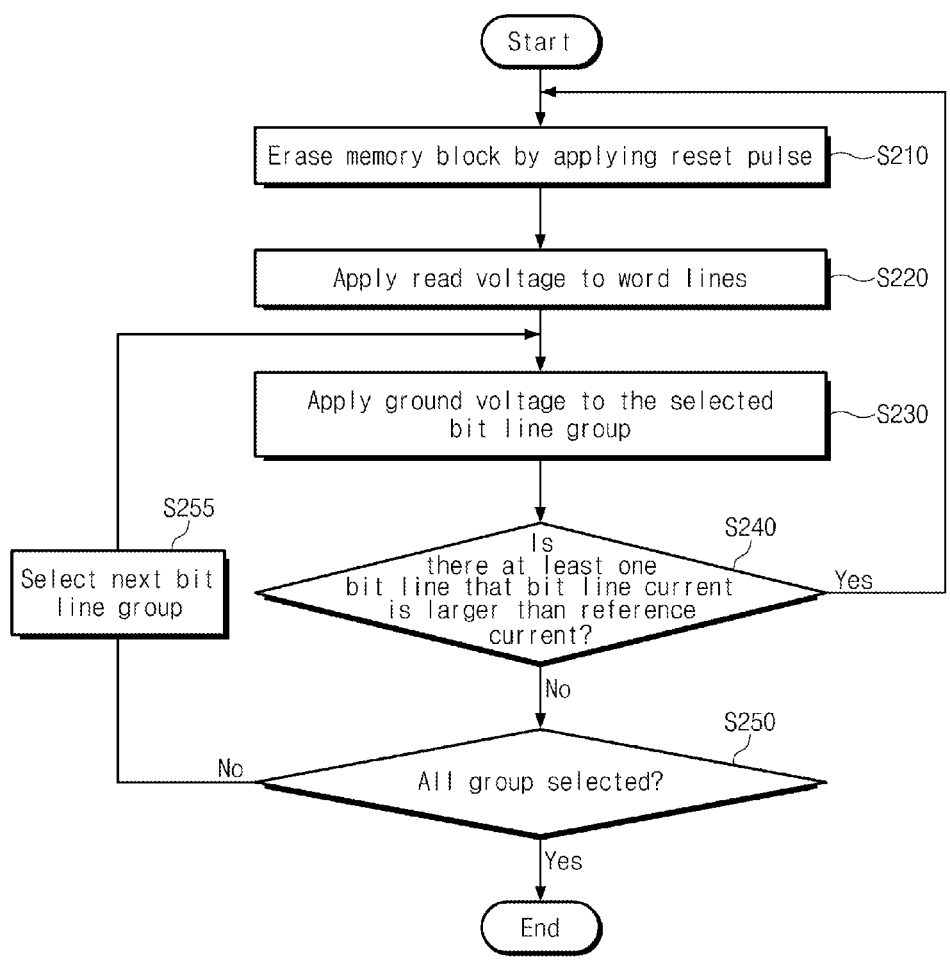
FIG. 7 is a flow chart illustrating the erase verifying method of FIG. 6.

FIG. 7 is a flow chart illustrating the erase verifying method of FIG. 6.

In operation S210, a selected memory block may be erased. The selected memory block may be erased by applying a reset pulse to memory cells of the selected memory block via address decoder 120 and column decoder 130.

In operation S220, a read voltage may be applied to a plurality of word lines of the selected memory block via address decoder 120. In at least one example embodiment, the address decoder 120 may apply a read voltage to all word lines of the selected memory block.

In operation S230, the column decoder 130 may apply a ground voltage to bit lines of the selected group, and a read voltage to bit lines of unselected group(s). Since the read voltage is applied to bit lines of an unselected group, no current may flow through the bit lines of the unselected group(s).

In operation S240, bit line currents of the bit lines of the selected group may be sensed by, for example, write driver and sense amplifier 140. The sensed bit line currents may be compared with a reference current. If at least one of the sensed bit line currents is larger than the reference current, an erase operation on memory cells not normally (or sufficiently) erased may be performed again. If all of the sensed bit line currents are less than the reference current, the method proceeds to operation S250.

In operation S250, whether all bit line groups are selected may be determined. If all bit line groups have not been selected, the method proceeds to operation S255, in which a next bit line group is selected. An erase verifying operation on a newly selected bit line group may be performed. If all bit line groups have been selected, an erase operation on the selected memory block may be ended.

According to at least one example embodiment, in the erase verifying method of the variable resistance memory device, a read voltage may be applied to a plurality of word lines. The variable resistance memory device may perform an erase verifying operation on memory cells connected to a plurality of word lines. For example, the erase verifying operation may be performed on multiple memory cells at the same time through one comparison operation. Thus, it is possible to expedite the erase verifying operation. Also, the variable resistance memory device 100 may divide bit lines into a plurality of groups and perform an erase verifying operation on each group of bit lines. Accordingly, a current consumed during the erase operation may be reduced, and an erase verifying operation may be accurately performed.

Figure 8:
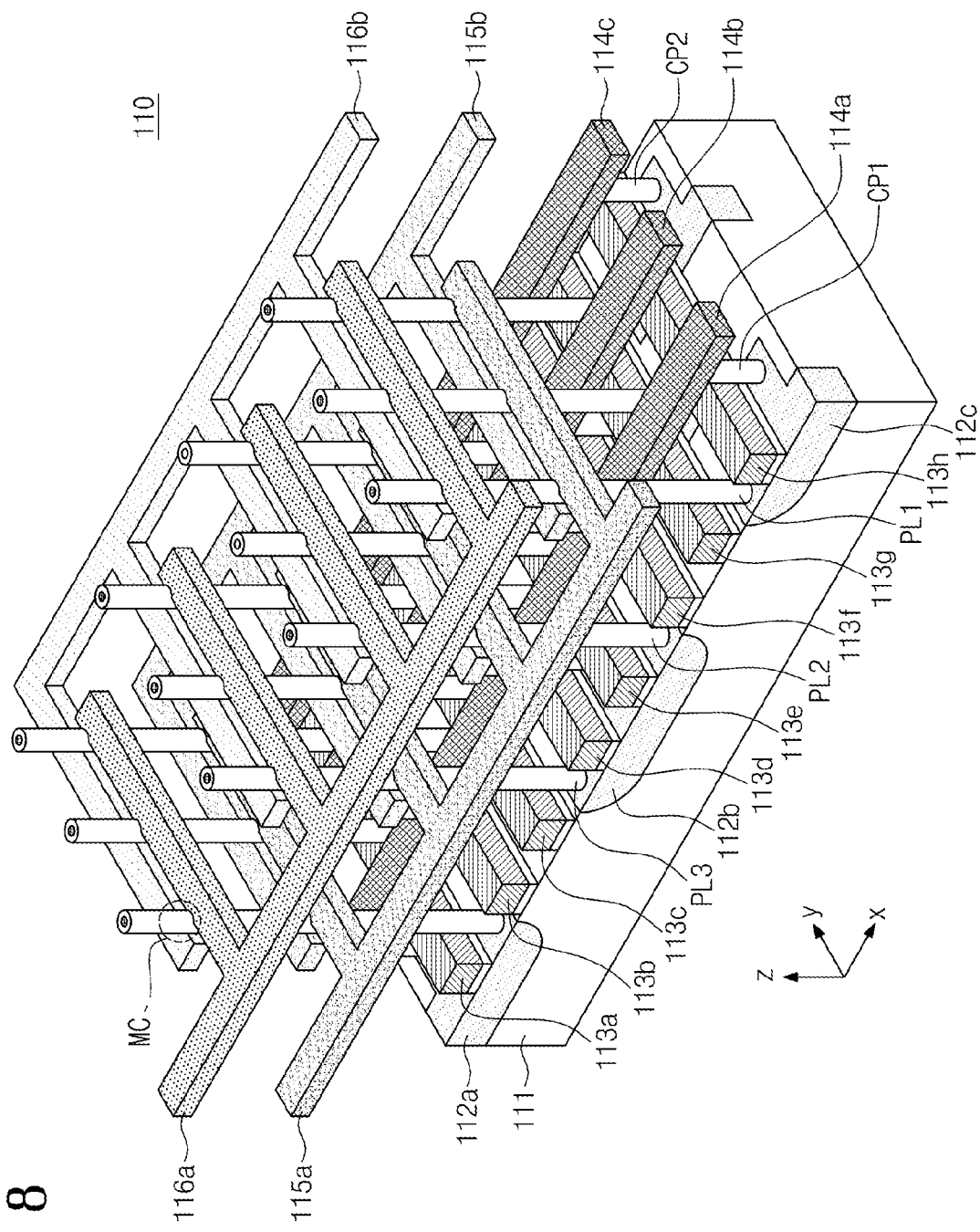
FIG. 8 is a perspective view of a three-dimensional structure of the memory cell array in FIG. 1.

FIG. 8 is a perspective view of a three-dimensional structure of the memory cell array in FIG. 1. Referring to FIG. 8, a memory cell array 110 may include structures extending along a plurality of directions x, y, and z.

A substrate 111 may be provided to form the memory cell array 110. The substrate 111 may be a p-well substrate. Alternatively, the substrate 111 may be a pocket p-well which is formed within an n-well substrate. Below, it is assumed that the substrate 111 is a p-well substrate. However, inventive concepts are not limited thereto.

A plurality of doping areas 112a to 112c may be formed in the substrate 111. For example, the doping areas 112a to 112c may be formed of n-type conductors. However, inventive concepts are not limited thereto.

The doping areas 112a to 112c may be formed sequentially in the x-direction. This structure may be repeated in the y-direction. Word lines 113a to 113h may be formed on the doping areas 112a to 112c and connected to metal lines formed at a plurality of layers. The word lines 113a to 113h may be electrically disconnected from the doping areas 112a to 112c.

The doping areas 112a to 112c may be connected to bit lines 114a to 114c extending in the x-direction by contact plugs CP1 and CP2, respectively. The bit lines 114a to 114c may be connected to vertical electrodes of pillars PL1 to PL4. Thus, the bit lines 114a to 114c and the vertical electrodes of the pillars PL1 to PL4 may be electrically connected by the doping areas 112a to 112c. The pillars PL1 to PL4 may be connected to metal line layers 115a, 115b, 116a, and 116b, which are stacked at a plurality of layers. The metal lines 115a and 115b may have a comb shape and be connected to pillars at a plurality of metal layers. The metal lines 115a and 115b may be connected to a global word line (not shown).

According to the above description, the memory cell array 110 of a variable resistance memory device 100 may be formed to have a three-dimensional structure. However, inventive concepts are not limited thereto. For example, memory cells may be stacked in various manners.

Figure 9:
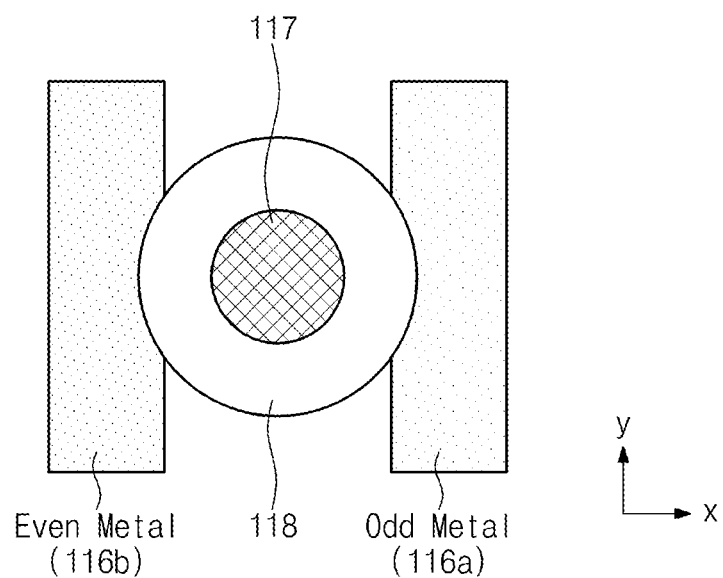
FIG. 9 is a cross-sectional view of a variable resistance memory cell formed at one layer, according to at least one example embodiment.

FIG. 9 is a cross-sectional view of a variable resistance memory cell formed at one layer, according to at least one example embodiment. Referring to FIG. 9, a memory cell MC may include a pillar 117 and 118 which is placed between a first metal line 116a and a second metal line 116b.

The pillar may extend in a direction (e.g., a z-direction) perpendicular to a substrate and may be formed between the metal lines 116a and 116b. Metal lines 116a and 116b may form a horizontal electrode. The pillar may include a data storage film 118 and a vertical electrode 117, each of which is formed to have a cylinder shape. The vertical electrode 117 may be connected to a bit line and the metal lines 116a and 116b may be connected to a word line in order to constitute a variable resistance memory cell. The data storage film 118 may be formed through etch and deposition processes in a vertical direction. The vertical electrode 117 may be formed by a deposition process, for example, a PVD, CVD or AVD method.

Figure 10:
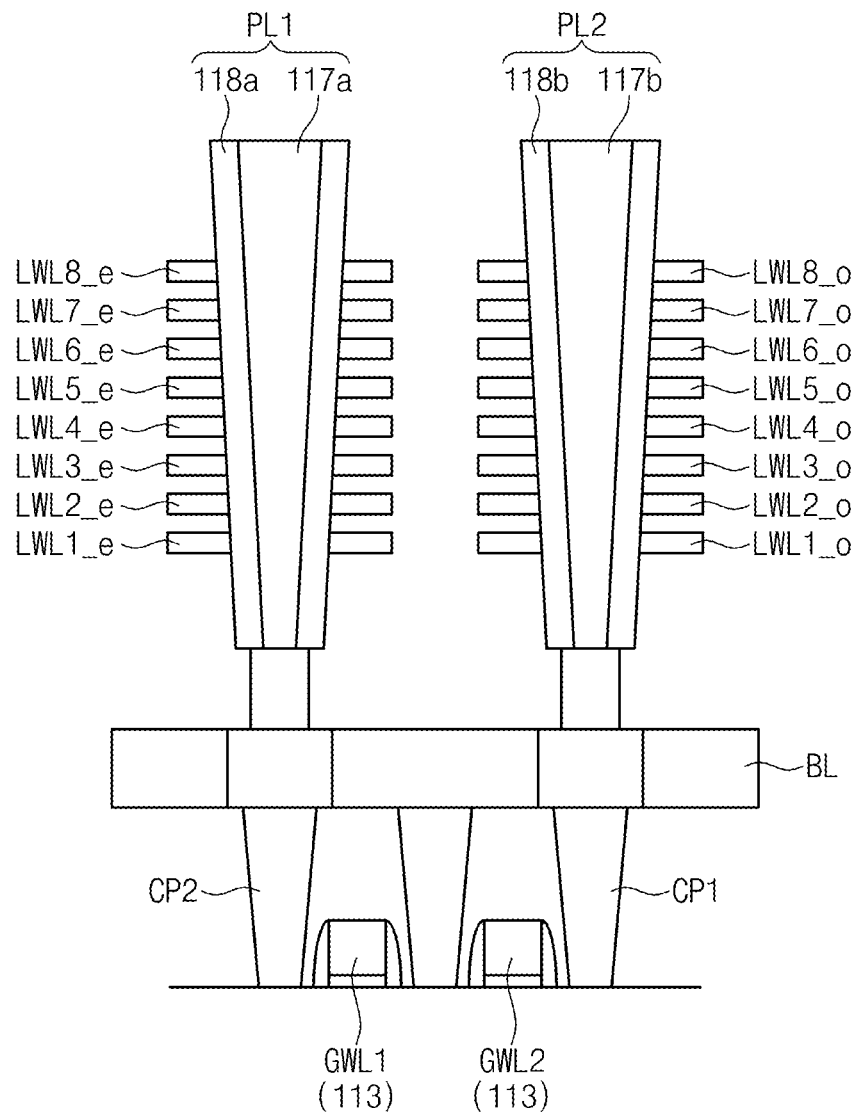
FIG. 10 is a diagram illustrating a cross section of FIG. 8.

FIG. 10 is a diagram illustrating a cross section of FIG. 8. FIG. 10 shows pillars PL1 and PL2 that constitute vertical electrodes and variable resistance memory cells, a plurality of horizontal electrodes LWL1_e to LWL8_e and LWL1_o to LWL8_o stacked on a substrate in a vertical direction, bit lines connected to the pillars PL1 and PL2 through doping areas, and global word lines GWL1 and GWL2 that provide word line voltages to the plurality of horizontal electrodes.

Figure 11:
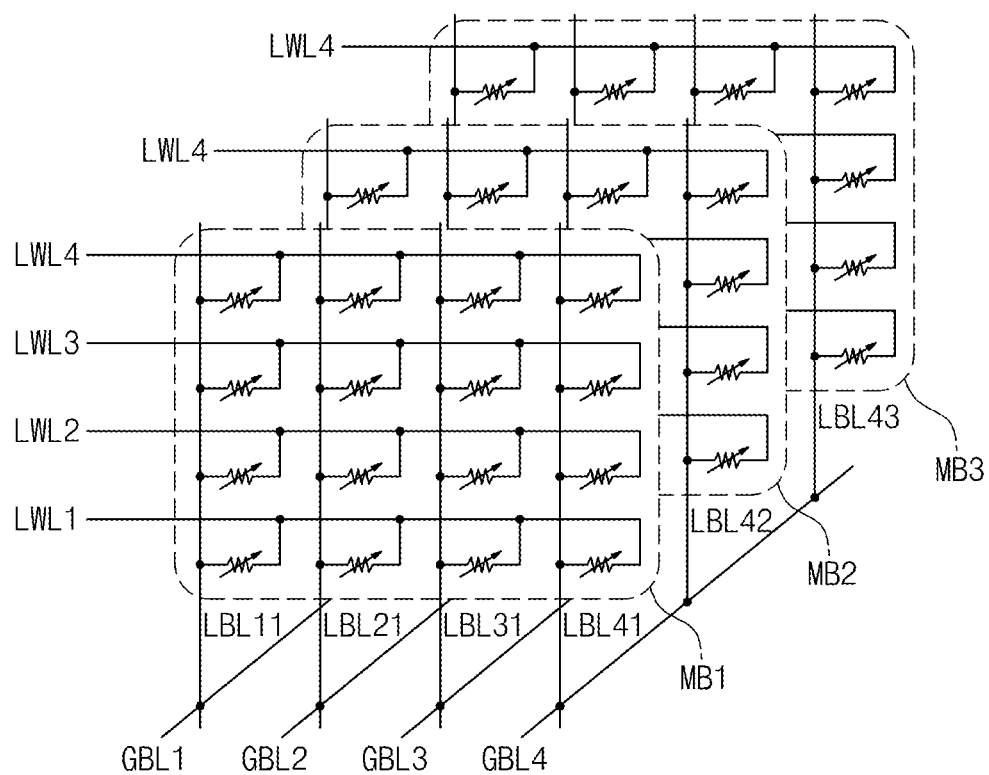
FIG. 11 is a circuit diagram schematically illustrating the memory cell array of FIG. 8.

FIG. 11 is a circuit diagram schematically illustrating the memory cell array of FIG. 8. Referring to FIG. 11, a memory cell array 110 may include a plurality of memory cells MB1 to MB3 which constitute a unit in the x-z plane.

The memory cell array 110 may include a plurality of local bit lines LBL11 to LBL43 parallel to one another and extending in a z-direction, and a plurality of local word lines LWL1 to LWL4 parallel to one another and extending in a y-direction that is perpendicular to the z-direction. Although not shown, the memory cells MB1 to MB3 may be connected with different local word lines.

Also, local bit lines LBL11 to LBL43, which are formed by vertical channels of pillars, may be connected to global bit lines GBL1 to GBL4, respectively. Variable resistance memory cells of the memory cell array 110 may be connected to the local word lines LWL1 to LWL4 and/or the local bit lines LBL11 to LBL43. The variable resistance memory cells may be programmed or sensed by voltages applied via the local word lines LWL1 to LWL4 and/or the local bit lines LBL11 to LBL43.

Figure 12:
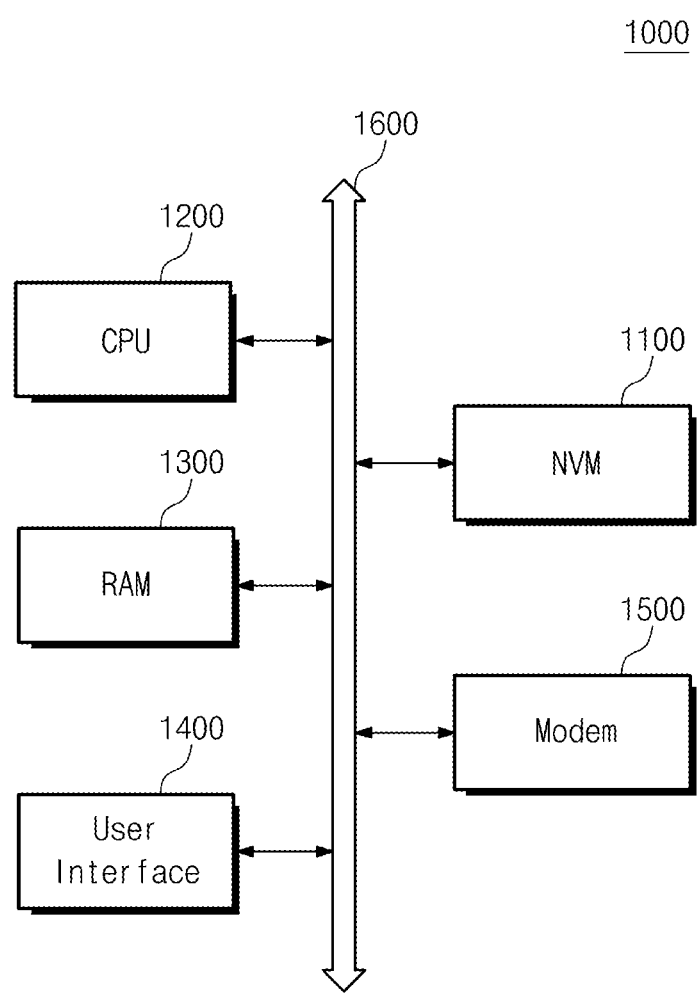
FIG. 12 is a block diagram schematically illustrating a computing system including a nonvolatile memory device according to at least one example embodiment of inventive concepts.

FIG. 12 is a block diagram schematically illustrating a computing system including a nonvolatile memory device according to at least one example embodiment of inventive concepts. Referring to FIG. 12, a computing system 1000 may include a nonvolatile memory device 1100, a CPU 1200, a RAM 1300, a user interface 1400, and a modem 1500 such as a baseband chipset which are connected to a system bus 1600. In FIG. 12, the nonvolatile memory device 1100 may be a variable resistance memory device of FIG. 1.

If the computing system 1000 is a mobile device, the computing system 1000 may further comprise a battery (not shown) for supplying an operating voltage to the computing system. Although not shown in FIG. 12, the computing system 1000 may further comprise an application chipset, a camera image processor (CIS), a mobile DRAM, and so on.

It should be understood that inventive concepts may be modified or changed without exceeding the scope of the application. For example, a memory cell array, a column decoder, and a write driver and sense amplifier block may be changed or modified variously according to an operating environment and use.

While inventive concepts have been described with reference to exemplary embodiments, it will be apparent to those skilled in the art that various changes and modifications may be made without departing from the spirit and scope of the following claims. Therefore, it should be understood that the above embodiments are not limiting, but illustrative.

What is claimed is:

1. An erase verifying method of a variable resistance memory device having a plurality of bit lines connected to a memory cell block, the method, comprising:
    applying a first voltage to a plurality of word lines connected to the memory cell block;
    applying a second voltage less than the first voltage to the plurality of bit lines connected to the memory cell block;
    sensing bit line currents flowing through the plurality of bit lines from the plurality of word lines;
    comparing the sensed bit line currents with a reference current; and
    determining that the memory cell block has been sufficiently erased by a first erase operation if each of the sensed bit line currents is less than the reference current,
    wherein the reference current is based on a product of the number of the plurality of word lines and an erase current, the erase current being a current flowing through a memory cell of the memory cell block.

2. The erase verifying method of claim 1, wherein the second voltage is a ground voltage.

3. The erase verifying method of claim 1, wherein the applying a first voltage includes applying the first voltage to all word lines connected to the memory cell block.

4. The erase verifying method of claim 1, further comprising:
    determining that the memory cell block has not been sufficiently erased by the first erase operation if at least one of the sensed bit line currents is greater than the reference current; and
    performing a second erase operation on the memory cell block.

5. The erase verifying method of claim 1, wherein the memory cell has a variable resistance value corresponding to an erase resistance, the erase resistance being a lower limit resistance value of the memory cell in an erased state.

6. The erase verifying method of claim 5, wherein the reference current has a value greater than a product of the number of the plurality of word lines and the erase current.

7. The erase verifying method of claim 1, wherein the reference current has a value less than a program current, the program current being a current flowing through a memory cell of the memory block, the memory cell having a variable resistance value corresponding to a program resistance, the program resistance being an upper limit resistance value of the memory cell in a programmed state.

8. The erase verifying method of claim 1, wherein the applying a second voltage includes applying the second voltage to all bit lines connected to the memory cell block.

9. An erase verifying method of a variable resistance memory device having a plurality of bit line groups connected to a memory cell block, each bit line group including more than one bit line, the method comprising:
    selecting one of the plurality of bit line groups;
    applying a first voltage to a plurality of word lines connected to the memory cell block;
    applying a second voltage less than the first voltage to the selected one of the plurality of bit line groups;
    applying the first voltage to unselected bit line groups;
    sensing bit line currents flowing through bit lines in the selected bit line group from the plurality of word lines;
    determining whether the memory cell block is sufficiently erased based on the sensed bit line currents,
    providing a reference current which is greater than a product of a number of the plurality of word lines and an erase current and less than a program current, the erase current being a current flowing through a first memory cell of the memory cell group; and
    comparing the sensed bit line currents with the reference current during the determining step.

10. The erase verifying method of claim 9, wherein the determining comprises:
    selecting a next bit line group if each of the sensed bit line currents is less than the reference current.

11. The erase verifying method of claim 10, wherein the memory cell block is determined to be sufficiently erased if each of the sensed bit line currents of all selected bit line groups is less than the reference current.

12. The erase verifying method of claim 10, wherein the first memory cell has a variable resistance value corresponding to an erase resistance, the erase resistance being a lower limit resistance value of the first memory cell in an erased state, the program current being a current flowing through a second memory cell of the memory cell group, the second memory cell having a variable resistance value corresponding to a program resistance, the program resistance being an upper limit resistance value of the second memory cell in a programmed state.

* * * * *